United States Patent
Kim et al.

(10) Patent No.: US 10,432,215 B2
(45) Date of Patent: Oct. 1, 2019

(54) OPTICAL CAMERA COMMUNICATION APPARATUS AND METHOD

(71) Applicant: YUYANG DNU CO., LTD., Hwaseong-si (KR)

(72) Inventors: Sang Ok Kim, Seoul (KR); Byung Oh Kim, Suwon-si (KR); Sang Ho Yoon, Suwon-si (KR); Tae Hoon Lee, Goyang-si (KR); Jung Il Han, Seongnam-si (KR); Jung Ho Lee, Seoul (KR)

(73) Assignee: YUYANG DNU Co., Ltd. (KR)

( * ) Notice: Subject to any disclaimer, the term of this patent is extended or adjusted under 35 U.S.C. 154(b) by 0 days.

(21) Appl. No.: 15/850,560

(22) Filed: Dec. 21, 2017

(65) Prior Publication Data
US 2019/0132000 A1    May 2, 2019

(30) Foreign Application Priority Data
Oct. 27, 2017    (KR) .................. 10-2017-0141501

(51) Int. Cl.
| | | |
|---|---|---|
| *H03M 7/00* | (2006.01) | |
| *H03M 5/12* | (2006.01) | |
| *H04B 10/116* | (2013.01) | |
| *H03M 5/08* | (2006.01) | |
| *H03M 5/10* | (2006.01) | |
| *H04B 10/524* | (2013.01) | |

(52) U.S. Cl.
CPC ............. *H03M 5/12* (2013.01); *H03M 5/08* (2013.01); *H03M 5/10* (2013.01); *H04B 10/116* (2013.01); *H04B 10/524* (2013.01)

(58) Field of Classification Search
CPC . H03M 5/12; H03M 5/08; H03M 5/10; H04B 10/116; H04B 10/524; H04N 19/107; H04N 19/46; H04N 19/61; H04N 21/235; H04N 21/236; H04N 21/434; H04N 21/435; H04N 21/8455; H04N 5/781; H04N 5/783; H04N 9/8042; H04N 9/8205
USPC ......................................... 341/60, 70
See application file for complete search history.

(56) References Cited

U.S. PATENT DOCUMENTS

| | | | |
|---|---|---|---|
| 5,535,008 A | * | 7/1996 | Yamagishi ............. G06T 9/004 375/E7.004 |
| 6,112,009 A | * | 8/2000 | Kikuchi ................ G06F 3/0601 386/241 |

(Continued)

FOREIGN PATENT DOCUMENTS

| | | |
|---|---|---|
| KR | 101100224 B1 | 12/2011 |
| KR | 10-2017-0107498 A | 9/2017 |
| WO | WO-2016115960 A1 | 7/2016 |

OTHER PUBLICATIONS

Trang Nguyen, et.al., "Design and Implementation of a Novel Compatible Encoding Scheme in the Time Domain for Image Sensor Communication".

(Continued)

*Primary Examiner* — Linh V Nguyen
(74) *Attorney, Agent, or Firm* — Harness, Dickey & Pierce, P.L.C.

(57) ABSTRACT

The present disclosure in some embodiments provides a transmit data structure and a communication method using the same, which can minimize the loss of the transmit data during the transmission and reception of the transmit data by optical camera communication.

15 Claims, 9 Drawing Sheets

(56) References Cited

U.S. PATENT DOCUMENTS

| | | | | |
|---|---|---|---|---|
| 6,229,952 B1* | 5/2001 | Nonomura | ............... | G09B 5/02 |
| | | | | 386/241 |
| 6,400,889 B1* | 6/2002 | Boon | ................... | G11B 27/105 |
| | | | | 386/353 |
| 2006/0198391 A1* | 9/2006 | Kim | ...................... | H04L 49/351 |
| | | | | 370/466 |
| 2006/0203826 A1* | 9/2006 | Cho | .................... | H04L 12/4645 |
| | | | | 370/395.53 |
| 2010/0175096 A1* | 7/2010 | Seo | ................ | H04N 21/234309 |
| | | | | 725/109 |
| 2017/0318134 A1 | 11/2017 | Du et al. | | |

OTHER PUBLICATIONS

IEEE std. 802.15.7.-2011 Part 15.7: Short-Range Wireless Optical Comm. Using Visible Light.

\* cited by examiner

-. SHR = Synchronization Header
PRBS 7 (Manchester Coded)
:(PRBS7 = x^7 + x^6 + 1, Initial State = 0x02) → 0000110 0000110

OPTICAL CAMERA COMMUNICATION APPARATUS AND METHOD

CROSS-REFERENCE TO RELATED APPLICATIONS

The present application is based on, and claims priority from, Korean Patent Application Number 10-2017-0141501, filed Oct. 27, 2017, the disclosure of which is incorporated by reference herein in its entirety.

TECHNICAL FIELD

The present disclosure relates to a data communication apparatus and method using an optical camera communication. More particularly, the present disclosure relates to a transmit data structure of an optical camera communication capable of minimizing the loss of a received signal while minimizing the complexity of a receiver.

BACKGROUND

The statements in this section merely provide background information related to the present disclosure and do not necessarily constitute prior art.

Visible light communication (VLC) is a communication technology, which utilizes light in the visible light Line Of Sight (LOS) channel environment with a light emitting diode (LED) and a photo detector (PD) to transmit and receive data.

Visible light communication uses blinking light for communications to require no permission for the use of a frequency spectrum, and it is harmless to the human body. In addition, visible light communication performs communications within the coverage of light, which can advantageously provide a specified range of communication. Visible light communication technologies conform to IEEE 802.15.7 standards, and active researches are now carried out in this field for improving data transmission/reception speed.

However, the visible light communication requires a photodetector for data reception, which increases the cost of constructing a communication system. As a solution, optical camera communication (OCC) has been proposed.

Optical camera communication is an applied technology of visible light communication, which uses a camera built in a smart device such as a smartphone or a digital camera as a photodetector.

The use of a camera, particularly an image sensor as a light detector in optical camera communication is advantageous in that a communication system can be constructed by utilizing the existing LED light source infrastructure, requiring neither modification nor additional cost. In the field of optical camera communication, standardization work is in progress on IEEE 802.15.7a, and researches are being actively carried out on utilization strategies with LED signboards and digital signage, etc.

Figure 1:
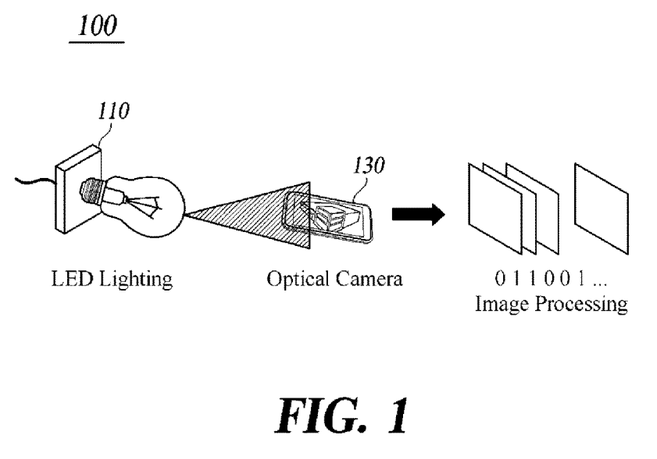
FIG. 1 is a schematic diagram of an optical camera communication system.

FIG. 1 is a schematic diagram of an optical camera communication system.

Referring to FIG. 1, an optical camera communication system 100 may include an LED light source 110 and an optical camera 130.

The LED light source 110 may transmit the transmit data by blinking light (that is, turning on/off the LED) based on binary information of transmit data. In addition, the LED light source 110 may simultaneously perform the lighting function and the communication function by blinking the light at a frequency of 100 Hz or more so that a person cannot recognize it.

The optical camera 130 may receive the transmit data from the LED light source 110 by using an image sensor (not shown). The optical camera 130 may receive the transmit data by subjecting the received optical signal to signal processing by spatially separating the received optical signal into each pixel of the image sensor.

Meanwhile, the speed of capturing moving images by the optical camera 130 is generally 30 fps (frame per second), but in practice it is variable irregularly. Therefore, in optical camera communication, the transmit data transmitted at a constant speed is sampled irregularly via the optical camera 130, resulting in the loss of the transmit data during data transmission and reception.

SUMMARY

In accordance with some embodiments, the present disclosure provides a method of performing an optical camera communication for transmitting a data frame, including generating a synchronization header (SHR) including a preamble used for performing a reception synchronization of the data frames, and generating a physical layer (PHY) header including a header check sequence (HCS) as an error detection code, and generating a PHY payload composed of PHY service data units (PSDUs) including a plurality of data packets, and combining the SHR, the PHY header and the PHY payload, to form the data frame. Here, the data packets each includes a plurality of data subpackets, and the data subpackets each comprises a start frame (SF) signal used for distinguishing the data subpackets from each other, a frame indicator (FI) signal indicating whether each of the data packets is transmitted in odd-numbered order or in even-numbered order, and a payload including transmit data.

In accordance with another embodiment, the present disclosure provides an apparatus for optical camera communication for transmitting a data frame, including a processor, a communication module and a memory device. The processor is configured to convert the data frame generated by using transmit data into an optical control signal. The communication module is configured to control blinking of an LED light source based on the optical control signal, so as to transmit an optical signal. The memory device is configured to store the data frame and the optical control signal. Here, the data frame comprises a synchronization header (SHR) including a preamble used for performing a reception synchronization of the data frame, a physical layer (PHY) header including a header check sequence (HCS) as an error detection code, and a PHY payload composed of PHY service data units (PSDUs) including a plurality of data packets. Each of the data packets includes a plurality of data subpackets each comprising a start frame (SF) signal used for distinguishing the data subpackets from each other, a frame indicator (FI) signal indicating whether each of the data packets is transmitted in odd-numbered order or in even-numbered order, and a payload including transmit data.

DETAILED DESCRIPTION

The present disclosure in some embodiments seeks to provide a transmit data structure and a communication method using the same, which can minimize the loss of transmit data occurring during the transmission and reception of data by optical camera communication.

Hereinafter, at least one embodiment of the present disclosure will be described in detail with reference to the accompanying drawings. In the following description, like reference numerals designate like elements, although the elements are shown in different drawings. Further, in the following description of the at least one embodiment, a detailed description of known functions and configurations incorporated herein will be omitted for the purpose of clarity and for brevity.

Additionally, various terms such as first, second, A, B, (a), (b), etc., are used solely for the purpose of differentiating one component from the other, but not to imply or suggest the substances, the order or sequence of the components. Throughout this specification, when a part "includes" or "comprises" a component, the part is meant to further include other components, not excluding thereof unless specifically stated to the contrary. The terms such as "unit", "module", and the like refer to units for processing at least one function or operation, which may be implemented by hardware, software, or a combination thereof.

Figure 2A:
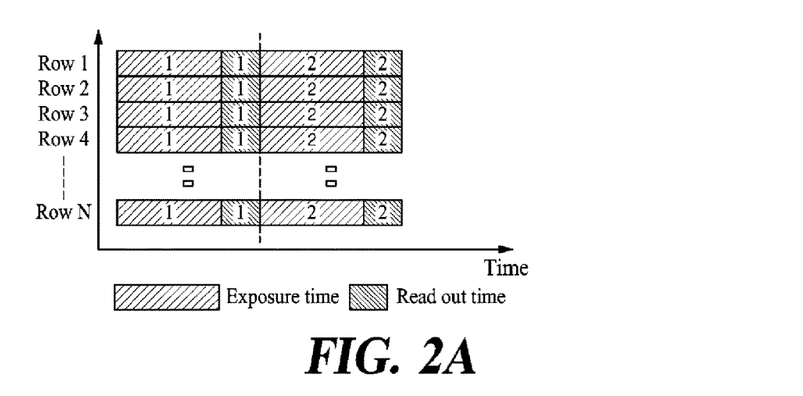
FIGS. 2A to 2C are diagrams of operations of receiving an optical signal in an optical camera communication system.
Figure 2B:
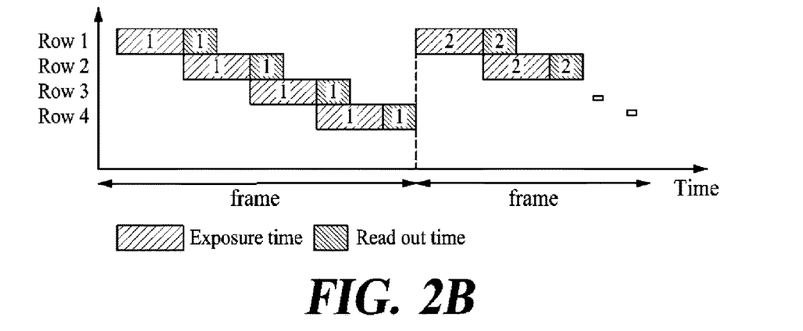
Figure 2C:
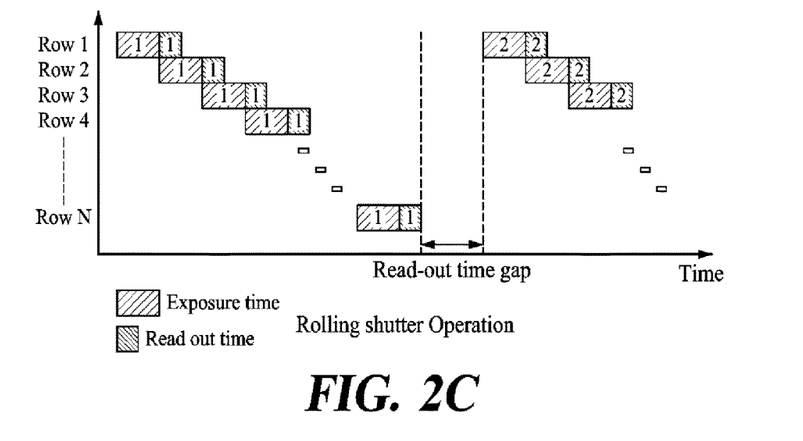

FIGS. 2A to 2C are diagrams of operations of receiving an optical signal in an optical camera communication system.

Referring to FIGS. 2A to 2C, the optical signal communication operations in the optical camera communication system may be divided into a global-shutter operation and a rolling-shutter operation. Incidentally, an exposure time in FIGS. 2A to 2C refers to the exposure time of an image sensor for receiving an optical signal, and a processing time or read-out time refers to the time for converting the received optical signal into an electrical signal and processing the electrical signal.

The ideal global-shutter operation shown in FIG. 2A is the optical signal reception operation mainly exercised by a charge-coupled device (CCD) image sensor. In the global-shutter operation, the entire pixels of the image sensor are exposed at a time to receive the optical signal, and the entire rows of an image frame are simultaneously exposed to the light source, and the signal conversion process is sequentially performed for each row. Therefore, with the global-shutter operation, the image sensor can receive only one piece of data (i.e., LED on/off information) for each image frame.

The ideal rolling-shutter operation shown in FIG. 2B is an optical signal reception operation mainly performed by a CMOS image sensor. In the rolling-shutter operation, pixels are exposed sequentially for each row of an image frame, an optical signal is received, and signal conversion processing is performed. In other words, in the rolling-shutter operation, the image sensor accumulates electric charges of optical signals received during the exposure time for each row, and performs the signal conversion processing at the read-out time. Therefore, with the rolling-shutter operation, the image sensor can receive a larger amount of data for each frame of the image than the global-shutter operation.

In addition to the irregular sampling time of the optical camera described above referring to FIG. 1, there is a read-out time gap as a cause of loss of transmit data occurring during the transmission and reception of optical camera communication. Referring to the actual rolling-shutter scheme shown in FIG. 2C, the presence of the time delay can be confirmed between the respective image frames. With the ideal rolling-shutter operation, as shown in FIG. 2B, the end of the processing time of the last row 4 of image frame 1 is immediately followed by the beginning of the exposure of the first row 1 of the next image frame 2. By contrast, in the case of the actual rolling-shutter operation, as shown in FIG. 2C, there is a time gap between the image frames, which may cause the loss of data between the image frames.

Therefore, the present disclosure in some embodiments provides a transmit data structure which minimizes such data loss that can actually occur in the optical camera communication using the rolling-shutter operation.

Figure 3:
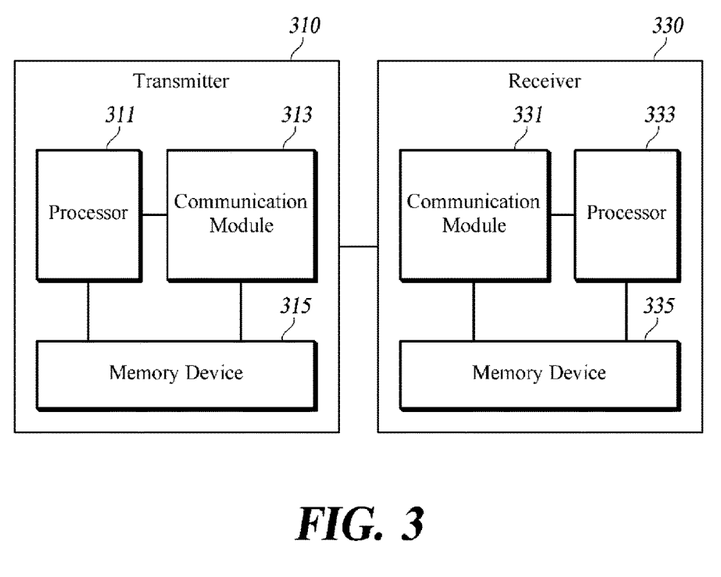
FIG. 3 is a schematic diagram of a configuration of a transmitter/receiver in an optical camera communication system according to some embodiments.

FIG. 3 is a schematic diagram of a configuration of a transmitter/receiver in an optical camera communication system according to some embodiments.

Referring to FIG. 3, the optical camera communication system 300 according to at least one embodiment may include a transmitter 310 and a receiver 330.

The transmitter 310 is adapted to convert transmit data into an optical signal and to transmit the optical signal, and it may include a processor 311, a communication module 313 and a memory device 315.

The transmitter 310 may be in the form of either a mobile or stationary terminal that includes at least one light source, for example, an light emitting diode (LED), an organic LED (OLED), a cold cathode fluorescent lamp (CCFL), or the like, or that can control an external light source outside of the transmitter 310.

According to at least one embodiment, the processor 311 may encode the transmit data by Manchester coding scheme and convert it so as to have a specific transmission structure. Here, the process of encoding and converting transmit data will be described in detail later with reference to FIGS. 5 to 7.

The communication module 313 may operate, based on the transmit data encoded and converted by the processor 311, to blink the light source inside or outside the transmitter 310, and thereby transmit an optical signal. At this time, the communication module 313 may control the blinking frequency of the light source, corresponding to the sampling rate of the receiver 330 (that is, the shutter speed of the optical camera). In particular, the communication module 313 may maintain the lighting function of the light source by controlling the frequency of blinking the light source to 100 Hz or more, which cannot be recognized by a person.

The memory device 335 may include a volatile memory (e.g., DRAM) and/or a nonvolatile memory (e.g., NAND flash memory), and it may store the transmit data input via the communication module 313 and the transmit data encoded and converted by the processor 311.

The receiver 330 is adapted to obtain transmit data from the received optical signal, and it may include a communication module 331, a processor 333 and a memory device 335.

The receiver 330 may be in the form of a mobile terminal such as a smartphone or a digital camera, including a camera, in particular an image sensor, or a stationary terminal such as closed circuit television (CCTV).

The communication module 331 may receive the optical signal and may include the image sensor of the optical camera 130 described above with reference to FIG. 1. According to some embodiments, the communication module 331 may receive the optical signal through the rolling-shutter operation.

The processor 333 may convert the received optical signal into transmit data. According to some embodiments, the processor 333 may decode the transmit data by the Manchester coding scheme.

The memory device 335 may include a volatile memory (e.g., DRAM) and/or a nonvolatile memory (e.g., NAND flash memory), and it may store the transmit data that are converted and decoded by the processor 333.

The following will detail, referring to FIGS. 4 to 7, the structure of the transmit data and the conversion process of the transmit data by the processor 311 according to some embodiments.

Figure 4:
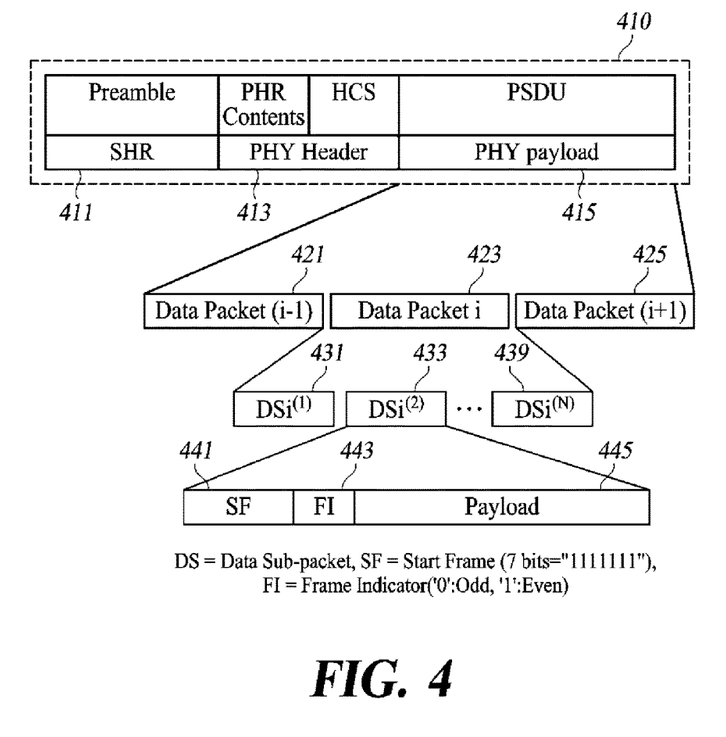
FIG. 4 is a diagram showing a transmit data structure in an optical camera communication system according to some embodiments.

FIG. 4 is a diagram showing a transmit data structure in an optical camera communication system according to some embodiments.

Referring to FIG. 4, the transmit data structure may take a data frame 410 as a base transmission unit. The transmit data may be converted into the data frame 410 by the processor 311 mentioned above by referring to FIG. 3, and they may be continuously transmitted as optical signals based on the data frame 410 by the communication module 313.

According to embodiments, the data frame 410 may be composed of 68 information units. Here, in case where the Manchester coding scheme is used as the encoding method, one information unit may be composed of 2 bits and is as follows.

The data frame 410 may include an SHR 411, a PHY header 413 and a PHY payload 415.

The SHR 411 may be a pseudo random binary sequence (PRBS), including a preamble used for synchronizing the received data frame 410. According to some embodiments, the SHR 411 may be composed of 14 units, and the specific method of generating SHR 411 will be described below with reference to FIG. 6.

The preamble includes signaling information representative of whether or not the data frame 410 is transmitted and of the start position of the data frame 410. The preamble may be composed of a bit string having a preset pattern.

The PHY header 413 may include control information on the physical layer of the optical camera communication system, and a header check sequence (HCS). Here, the control information may include information on the size of the information unit and the coding scheme used. The HCS may be composed of at least one bit, serving as an error detecting code used for determining whether or not a transmission error has occurred in the PHY header 413. According to some embodiments, the HCS may be composed of 8 bits, and a specific method of generating the HCS will be described below with reference to FIG. 7.

According to embodiments, the PHY header 413 may be composed of 20 units and may further include a frame repetition (FR) signal. Here, the FR signal includes binary information indicating whether to repeatedly transmit data packets 421, 423 and 425 to be described later, and the FR signal may be formed of at least one bit.

For example, a 1-bit FR signal having a value '1' may indicate that there is at least one data packet pair present for each transmit data, and a 1-bit FR signal having a value '0' may indicate that there is one data packet for each transmit data. More specifically, referring to FIG. 4, when the 1-bit FR signal value is '1', the 'i−1'th data packet 421 and the 't'h data packet 423 make up one data packet pair of the first transmit data, and the 'i+1'th data packet 425 becomes one data packet of the second transmit data. Conversely, when the 1-bit FR signal value is '0', the 'i−1'th data packet 421 represents a data packet of the first transmit data, the 'i'th data packet 423 represents a data packet of the second transmit data, and the 'i+1'th data packet 425 represents the data packet of the third transmit data, and thereby all three data packets each represents the different transmit data.

The PHY payload 415 may include a PHY service data unit (PSDU) including transmit data actually transmitted and received from and to an upper layer than the physical layer. According to some embodiments, the PHY payload 415 may be composed of 34 units, in order to remove flicker, it may be encoded by using Manchester coding scheme. Here, the coding scheme of the PHY payload 410 may be included in the above-described PHY header 413 as control information on the physical layer.

The PSDU may include at least one of data packets 421, 423 and 425. Although FIG. 4 shows that the PSDU contains three data packets 421 to 425, this is exemplary, and this number of data packets does not limit the embodiments in any way.

When a data packet is repeatedly transmitted (for when the aforementioned 1-bit FR signal value is '1'), the paired data packets 421 and 423 may include the same transmit data. Conversely, when a data packet is not repeatedly transmitted (for when the aforementioned 1-bit FR signal value is '0'), the data packets 421 to 423 may each contain different transmit data.

Each of the data packets 421, 423 and 425 may then include a plurality of data subpackets 431 to 439. The plurality of data subpackets 431 to 435 belonging to the same data packet 423 may contain the same transmit data.

According to embodiments, each of the data packets 421 to 425 may include four (4) data subpackets. Here, the number 4 is a value determined experimentally in order to minimize signal loss in the communication environment where an optical camera without optical zoom function is distanced by 3 m or more from the LED light source and thereby looses ⅔ or more of the data frame received.

In this case, when the data packet is repeatedly transmitted (that is, the value of the 1-bit FR signal is '1'), the same transmit data is repeatedly transmitted a total of 8 times (=4×2). This way of repeated transmitting of the same transmit data in this manner can minimize the loss of the signal of the transmit data due to the irregular sampling rate of the optical camera 130.

With a test conducted in the communication environment where the blinking frequency of the LED light source is 2.025 KHz and the shutter speed of the optical camera is 30 fps (frame per second), when the same transmit data was repeatedly transmitted eight times, the data transfer rate was 130 bps (bit per second).

Each of the data subpackets 431 to 439 may include a start frame (SF) signal 441, a frame indicator (FI) signal 443 and a payload signal 445.

The SF signal 441 may be a bit string having a preset pattern, signaling the start of a payload by distinguishing each of the data subpackets 431 to 439. According to some embodiments, the SF signal 441 may be composed of 7 bits having uniform bit values of '1s' (i.e., '1111111'). In the communication environment where the SHR 411 or the PHY header 413 may not be transmitted and received without an error, the SF signal 441 may be used for distinguishing between the data subpackets 431 to 439 including the transmit data.

The FI signal may include information on the transmission order of the data packets 421 to 425. According to some embodiments, the FI signal 443 may be composed of one bit, including binary information indicating whether the transmission order of the data packets 421 to 425 is an odd or even number. Specifically, the 1-bit FI signal 443 of the data packet transmitted in odd-numbered order may have the bit value of '0', and the 1-bit FI signal 443 of the data packet transmitted in even-numbered order may have the bit value of '1'. In this case, in FIG. 4, the 1-bit FI signal 443 of the first transmitted 'i−1'th data packet 421 may have the bit value of '0', the 1-bit FI signal 443 of the second transmitted 'i'th data packet 423 may have the bit value of '1', and the 1-bit FI signal 443 of the third transmitted 'i+1'th data packet 425 may have the bit value of '0'.

In order to distinguish between the respective data subpackets 431 to 439 in the received data frame 410, the processor 333 mentioned above referring to FIG. 3 takes the correlation of the SF signal 441 and the FI signal 443 therefrom, and thereby improves the accuracy of distinction and the reliability of the correlation peak.

In addition, the payload 445 includes transmit data, and it may be encoded by the Manchester coding scheme.

Figure 5:
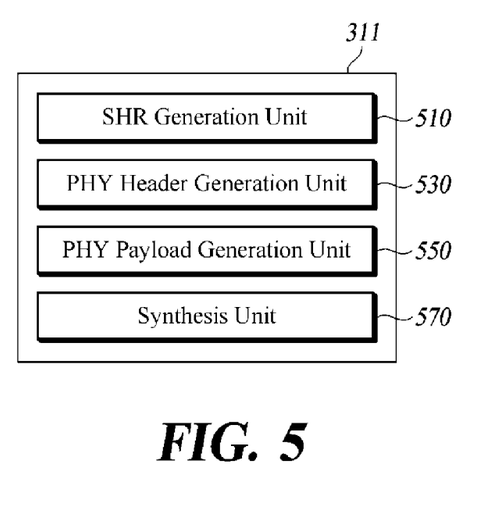
FIG. 5 is a diagram showing a configuration of a processor on the transmission side in an optical camera communication system according to some embodiments.

FIG. 5 is a diagram showing a configuration of the processor 311 on the side of the transmitter 310 in an optical camera communication system according to some embodiments.

Referring to FIG. 5, the processor 311 includes an SHR generation unit 510, a PHY header generation unit 530, a PHY payload generation unit 550 and a combining or synthesis unit 570. This is, however, merely equivalent components to the 'conversion operation of transmit data' executed by the processor 311 for the sake of convenience of explanation. Therefore, although not depicted in the drawing, the processor 311 may further include the components necessary for controlling general operations of the transmitter 310.

The SHR generation unit 510 may generate an SHR including a preamble for reception synchronization of a data frame. A specific method of generating an SHR will be described below with reference to FIG. 6.

The PHY header generation unit 530 may generate a PHY header including control information on the physical layer of the optical camera communication system, and an HCS. Here, the control information may include information on an information unit indicator and information on the encoding scheme used. The HCS may be used for determining whether or not a transmission error has occurred in the PHY header during the transmission and reception of the transmit data. According to embodiments, the PHY header may further include a frame repetition (FR) signal including binary information indicating whether or not the data packets 421 to 425 are repeatedly transmitted. A specific method of generating the PHY header will be described with reference to FIG. 7.

The PHY payload generation unit 550 may generate the PHY payload by encoding the transmit data. Here, the PHY payload includes a plurality of data packets, and each of the data packets may include a plurality of data subpackets. The data subpacket may be composed of an SF signal for distinguishing between data subpackets, an FI signal for distinguishing repeatedly transmitted data packets, and a payload signal including encoded transmit data.

The combining unit 560 may synthesize or combine the SHR, the PHY header and the PHY payload to generate a data frame.

Figure 6:
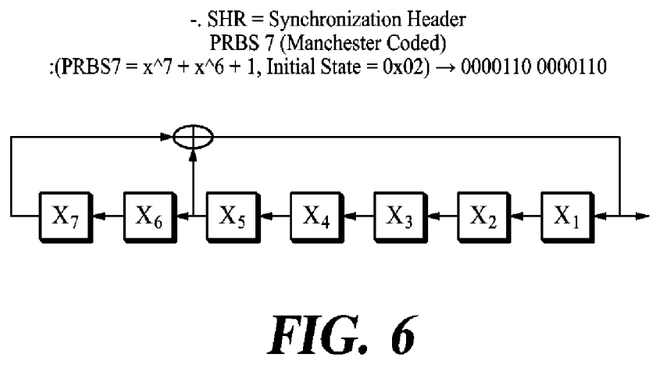
FIG. 6 is a diagram showing a method of generating a synchronization header (SHR) in an optical camera communication system according to some embodiments.

FIG. 6 is a diagram showing a method of generating a synchronization header (SHR) in an optical camera communication system according to some embodiments.

Referring to FIG. 6, the SHR according to some embodiments may be generated with an SHR generating circuit composed of a linear feedback shift register and an exclusive OR (XOR) component by a generator polynomial $g(x)=x^7+x^6+1$ of 7-bit pseudo-random binary sequence (PRBS). Incidentally, the 7-bit PRBS generator polynomial may be represented by binary numbers '1100 0001'.

When the initial state of the SHR generating circuit is "0x02", the bit value of the generated SHR may be '0000110 0000110'.

Figure 7:
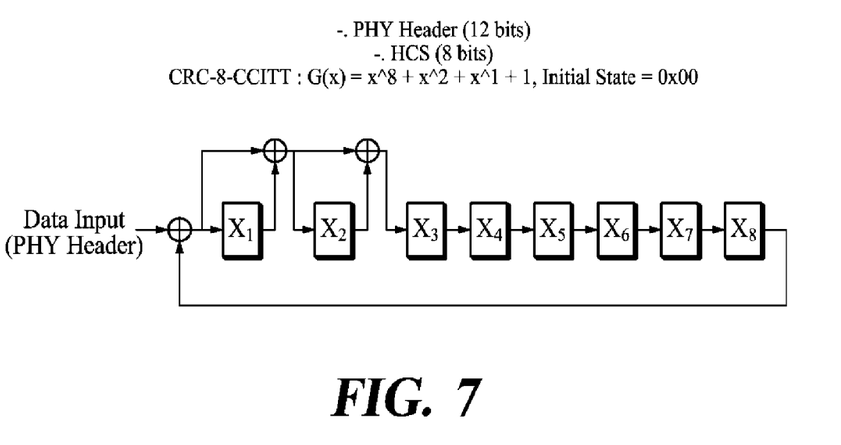
FIG. 7 is a diagram showing a method of generating a Header Check Sequence (HCS) in an optical camera communication system according to some embodiments.

FIG. 7 is a diagram showing a method of generating a header check sequence (HCS) in an optical camera communication system according to some embodiments.

The HCS is a signal used for determining whether or not a transmission error has occurred in the PHY header, and it may be composed of at least one bit.

Referring to FIG. 7, the HCS according to some embodiments may be generated with an HCS coding circuit (having an initial state of '0x00') composed of a linear feedback shift register and an exclusive OR (XOR) component by a generator polynomial $g(x)=x^8+x^2+x+1$ of a CRC-8-CCITT algorithm. At this time, the generated HCS may be composed of seven bits included in the 12-bit PHY header.

Figure 8:
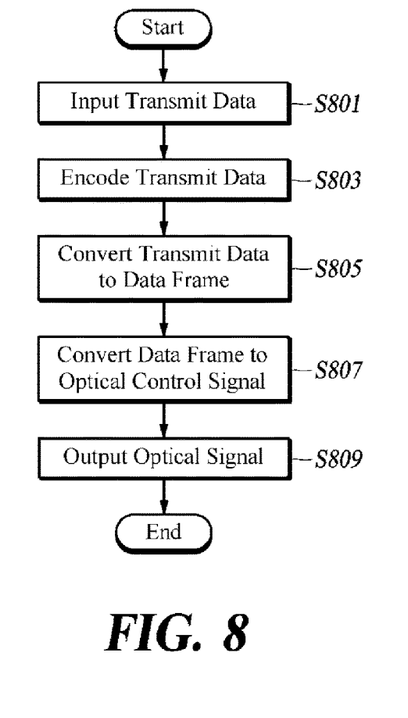
FIG. 8 is a flowchart of a method of transmitting transmit data in an optical camera communication system according to some embodiments.

FIG. 8 is a flowchart schematically showing a method of transmitting transmit data in an optical camera communication system according to some embodiments. Hereinafter, referring to FIG. 3 and FIG. 8, a method of transmitting transmit data according to some embodiments will be described.

In Step S801, the communication module 313 may receive an input of transmit data. Then, the transmit data may be stored in the memory device 315.

In Step S803, the processor 311 may encode the transmit data using the Manchester coding scheme. The encoded transmit data may then be stored in the memory device 315.

In Step S805, the processor 311 may convert the encoded transmit data so as to have the transmit data structure according to some embodiments. Specifically, the processor 311 may generate a data frame by generating the SHR header, the PHY header and the PHY payload, respectively, and synthesizing (or combining) them. Then, the generated data frame may be stored in the memory device 315. The transmit data structure according to some embodiments is as described above with reference to FIGS. 4 to 6, so a detailed description will be omitted.

In Step S807, the processor 311 may convert the data frame into an optical control signal. As a specific example, the processor 311 may generate an optical control signal that turns on the LED light source ('on' state) in response to bit value '1' in the encoded data frame, and turns off the LED light source ('off' state) in response to bit value '0' in the encoded data frame. Then, the generated optical control signal may be stored in the memory device 315.

In Step S809, the communication module 313 may control the blinking of the light source inside or outside the transmitter 310 based on the optical control signal generated in Step S807, so as to output the optical signal.

Figure 9:
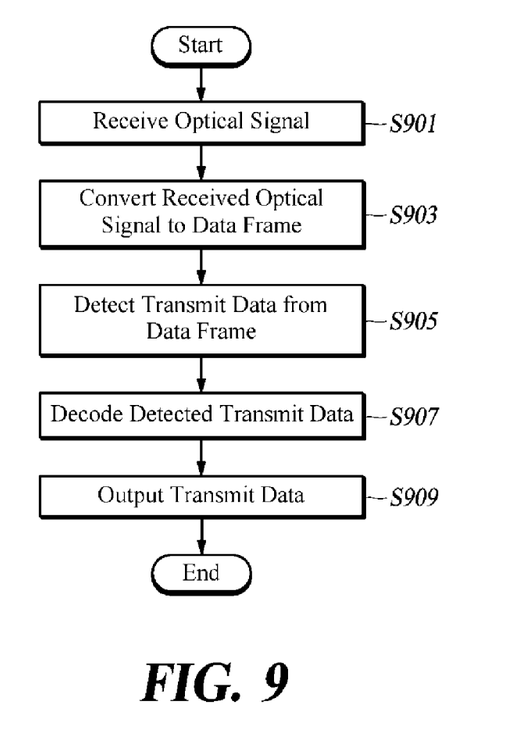
FIG. 9 is a flowchart of a method of receiving transmit data in an optical camera communication system according to some embodiments.

FIG. 9 is a flowchart schematically showing a method of receiving transmit data in an optical camera communication system according to some embodiments. Hereinafter, with reference to FIG. 3 and FIG. 9, a method of receiving transmit data according to some embodiments will be described.

In Step S901, the communication module 331 may receive the optical signal output from the transmitter 310. The communication module 331 may receive the optical signal by releasing the shutter of the optical camera at a preset speed (for example, 30 fps). According to some embodiments, the shutter releasing of the optical camera may employ a rolling shutter system.

In Step S903, the processor 333 may convert the optical signal received in Step S901 into a data frame based on a predetermined 'time interval of LED on/off'.

In Step S905, the processor 333 may detect the transmit data from the data frame converted in step S903. Then, the detected transmit data may be stored in the memory device 315.

In Step S907, the processor 333 may decode the transmit data detected in step S905. According to some embodiments, the processor 333 may decode the transmit data by using the Manchester coding scheme. Then, the decoded transmit data may be stored in the memory device 315.

In Step S909, the communication module 331 may output the transmit data decoded in Step S907 to a data reading device (not shown). Then, the transmit data read by the data reading device may be visually displayed to the user via a display device (not shown) or the like.

Although the multiple steps in FIGS. 8 and 9 are described to be sequentially performed as mere examples for describing the technical idea of some embodiments, one of ordinary skill in the pertinent art would appreciate that various modifications, additions and substitutions are possible by performing the illustrated sequences in FIGS. 8 and 9 in a different order or at least one of those steps in parallel without departing from the idea and scope of the embodiments, and hence the examples shown in FIGS. 8 and 9 are not limited to the chronological orders.

The steps shown in FIGS. 8 and 9 can be implemented as computer-readable codes on a computer-readable recording medium. The computer-readable recording medium includes any type of recording device on which data that can be read by a computer system are recordable. Examples of the computer-readable recording medium include a magnetic recording medium (e.g., a ROM, a floppy disk, a hard disk, etc.), an optically readable medium (e.g., a CD-ROM, a DVD, etc.), and the like, and also include one implemented in the form of a carrier wave (e.g., transmission through the Internet). Further, the computer-readable recording medium can be distributed in computer systems connected via a network, and computer-readable codes can be stored and executed in a distributed mode.

The optical camera communication system using the transmit data structure according to some embodiments as described above can minimize transmit data loss which increases in proportion to the distance between the LED light source and the optical camera. Further, the optical camera communication system using the transmit data structure according to some embodiments provides a reception synchronization processor for the transmit data with minimal complexity.

Although exemplary embodiments of the present disclosure have been described for illustrative purposes, those skilled in the art will appreciate that various modifications, additions and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the explicitly described above embodiments but by the claims and equivalents thereof.

What is claimed is:

1. A method of performing an optical camera communication for transmitting a data frame, the method comprising:
    generating with a processor a synchronization header (SHR) including a preamble used for performing a reception synchronization of the data frame;
    generating with the processor a physical layer (PHY) header including a header check sequence (HCS) as an error detection code;
    generating with the processor a PHY payload composed of PHY service data units (PSDUs) including a plurality of data packets; and
    combining the SHR, the PHY header and the PHY payload with the processor, to form the data frame, wherein the data packets each include a plurality of data subpackets, and
    wherein the data subpackets each comprise a start frame (SF) signal used for distinguishing the data subpackets from each other, a frame indicator (FI) signal indicating whether each of the data packets is transmitted in odd-numbered order or in even-numbered order, and a payload including transmit data.

2. The method of claim 1, wherein the PHY header further includes a frame repetition (FR) signal indicating whether or not a data packet including same transmit data is repeatedly transmitted.

3. The method of claim 1, wherein the SHR is generated by a 7-bit pseudo-random binary sequence (PRBS).

4. The method of claim 1, wherein the HCS is generated by a CRC-8-CCITT algorithm.

5. The method of claim 1, wherein the transmit data is encoded by Manchester coding scheme.

6. The method of claim 1, further comprising transmitting an optical signal by controlling blinking of an LED light source based on the data frame.

7. An apparatus for optical camera communication for transmitting a data frame, the apparatus comprising:
    a processor configured to convert the data frame generated by using transmit data into an optical control signal;
    a communication module configured to control blinking of an LED light source based on the optical control signal, so as to transmit an optical signal;
    a memory device configured to store the data frame and the optical control signal, wherein
    the data frame comprises a synchronization header (SHR) including a preamble used for performing a reception synchronization of the data frame, a physical layer (PHY) header including a header check sequence (HCS) as an error detection code, and a PHY payload composed of PHY service data units (PSDUs) including a plurality of data packets, and wherein each of the data packets comprises a plurality of data subpackets each including a start frame (SF) signal used for distinguishing the data subpackets from each other, a frame indicator (FI) signal indicating whether each of the data packets is transmitted in odd-numbered order or in even-numbered order, and a payload including transmit data.

8. The apparatus of claim 7, wherein the PHY header further includes a frame repetition (FR) signal indicating whether or not a data packet including a same transmit data is repeatedly transmitted.

9. The apparatus of claim 7, wherein the SHR is generated by a 7-bit pseudo-random binary sequence (PRBS).

10. The apparatus of claim 7, wherein the HCS is generated by a CRC-8-CCITT algorithm.

11. The apparatus of claim 7, wherein the transmit data is encoded by Manchester coding scheme.

12. The method of claim 1, further comprising:
generating the SHR with an SHR generating circuit of the processor composed of a linear feedback shift register and an exclusive OR (XOR) component by a generator polynominal of a 7-bit pseudo-random binary sequence (PRBS); and
generating the HCS with an HCS coding circuit of the processor composed of a linear feedback shift register and an exclusive OR (XOR) component by a generator polynominal of a CRC-8-CCITT algorithm.

13. The method of claim 12, wherein:
the generator polynomial of the 7-bit PRBS of the SHR generating circuit is $g(x)=x^7+x^6+1$; and
the generator polynomial of the CRC-8-CCITT algorithm of the HCS coding circuit is $g(x)=x^8+x^2+x+1$.

14. The apparatus of claim 7, wherein:
the SHR is generated with an SHR generating circuit of the processor composed of a linear feedback shift register and an exclusive OR (XOR) component by a generator polynomial of a 7-bit pseudo-random binary sequence (PRBS); and
the HCS is generated with an HCS coding circuit of the processor composed of a linear feedback shift register and an exclusive OR (XOR) component by a generator polynominal of a CRC-8-CCITT algorithm.

15. The apparatus of claim 14, wherein:
the generator polynomial of the 7-bit PRBS of the SHR generating circuit is $g(x)=x^7+x^6+1$; and
the generator polynomial of the CRC-8-CCITT algorithm of the HCS coding circuit is $g(x)=x^8+x^2+x+1$.

* * * * *